United States Patent
Schoner et al.

(10) Patent No.: US 12,034,001 B2
(45) Date of Patent: *Jul. 9, 2024

(54) CONCEPT FOR SILICON CARBIDE POWER DEVICES

(71) Applicant: II-VI Delaware, Inc., Wilmington, DE (US)

(72) Inventors: Adolf Schoner, Hasselby (SE); Nicolas Thierry-Jebali, Stockholm (SE); Christian Vieider, Uppsala (SE); Sergey Reshanov, Upplands-Vasby (SE); Hossein Elahipanah, Sollentuna (SE); Wlodzimierz Kaplan, Sollentuna (SE)

(73) Assignee: II-VI ADVANCED MATERIALS, LLC, Pine Brook, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/295,743

(22) Filed: Apr. 4, 2023

(65) Prior Publication Data

US 2023/0246020 A1     Aug. 3, 2023

Related U.S. Application Data

(63) Continuation of application No. 17/577,226, filed on Jan. 17, 2022, now Pat. No. 11,652,099, which is a
(Continued)

(30) Foreign Application Priority Data

Sep. 15, 2017    (SE) ..................................... 1751136-1

(51) Int. Cl.
*H01L 21/00*       (2006.01)
*H01L 21/82*       (2006.01)
(Continued)

(52) U.S. Cl.
CPC ...... *H01L 27/0605* (2013.01); *H01L 21/8213* (2013.01); *H01L 27/0629* (2013.01);
(Continued)

(58) Field of Classification Search
CPC ............. H01L 27/0605; H01L 21/8213; H01L 27/0629; H01L 29/0615; H01L 29/0623;
(Continued)

(56) References Cited

U.S. PATENT DOCUMENTS

| | | |
|---|---|---|
| 2,705,406 A | 4/1955 | Morrison |
| 5,693,569 A | 12/1997 | Ueno |

(Continued)

FOREIGN PATENT DOCUMENTS

| | | |
|---|---|---|
| EP | 2058854 A2 | 5/2009 |
| EP | 2075847 A1 | 7/2009 |

(Continued)

OTHER PUBLICATIONS

Bakowski, "Bakowski, "Prospects and Development of Vertical Normally-off JFETs in SiC," Journal of Telecommunications and Information Technology, Apr. 2009, pp. 25-36.".

(Continued)

*Primary Examiner* — Richard A Booth
(74) *Attorney, Agent, or Firm* — Blank Rome LLP

(57) ABSTRACT

A modular concept for Silicon Carbide power devices is disclosed where a low voltage module (LVM) is designed separately from a high voltage module (HVM). The LVM having a repeating structure in at least a first direction, the repeating structure repeats with a regular distance in at least the first direction, the HVM comprising a buried grid (4) with a repeating structure in at least a second direction, the repeating structure repeats with a regular distance in at least
(Continued)

the second direction, along any possible defined direction. Advantages include faster easier design and manufacture at a lower cost.

20 Claims, 9 Drawing Sheets

Related U.S. Application Data continuation of application No. 16/647,067, filed as application No. PCT/EP2018/074905 on Sep. 14, 2018, now Pat. No. 11,276,681.

(51) Int. Cl.

| | | |
|---|---|---|
| *H01L 27/06* | (2006.01) | |
| *H01L 29/06* | (2006.01) | |
| *H01L 29/10* | (2006.01) | |
| *H01L 29/16* | (2006.01) | |
| *H01L 29/36* | (2006.01) | |
| *H01L 29/417* | (2006.01) | |
| *H01L 29/66* | (2006.01) | |
| *H01L 29/78* | (2006.01) | |

(52) U.S. Cl.
CPC ...... *H01L 29/0615* (2013.01); *H01L 29/0623* (2013.01); *H01L 29/1095* (2013.01); *H01L 29/1608* (2013.01); *H01L 29/36* (2013.01); *H01L 29/41741* (2013.01); *H01L 29/66068* (2013.01); *H01L 29/7806* (2013.01); *H01L 29/7811* (2013.01); *H01L 29/7813* (2013.01)

(58) Field of Classification Search
CPC . H01L 29/1095; H01L 29/1608; H01L 29/36; H01L 29/41741; H01L 29/66068; H01L 29/7806; H01L 29/7811; H01L 29/7813
See application file for complete search history.

(56) References Cited

U.S. PATENT DOCUMENTS

| | | | |
|---|---|---|---|
| 6,049,108 A | 4/2000 | Williams et al. | |
| 6,091,108 A | 7/2000 | Harris et al. | |
| 6,104,043 A | 8/2000 | Hermansson et al. | |
| 6,673,662 B2 | 1/2004 | Singh | |
| 6,897,133 B2 | 5/2005 | Collard | |
| 6,936,850 B2 | 8/2005 | Friedrichs et al. | |
| 6,979,863 B2 | 12/2005 | Ryu | |
| 7,851,881 B1 | 12/2010 | Zhao et al. | |
| 8,633,560 B2 | 1/2014 | Aketa | |
| 8,704,295 B1 | 4/2014 | Darwish et al. | |
| 9,577,046 B1 | 2/2017 | Hori et al. | |
| 11,276,681 B2 * | 3/2022 | Schöner | H01L 27/0605 |
| 11,652,099 B2 * | 5/2023 | Schöner | H01L 29/66068 257/77 |
| 2003/0201464 A1 | 10/2003 | Hokomoto | |
| 2006/0255423 A1 | 11/2006 | Ryu et al. | |
| 2007/0001194 A1 | 1/2007 | Ono et al. | |
| 2007/0029573 A1 | 2/2007 | Cheng et al. | |
| 2007/0170436 A1 | 7/2007 | Sugawara | |
| 2007/0228505 A1 | 10/2007 | Mazzola et al. | |
| 2011/0021533 A1 | 1/2011 | Cook et al. | |
| 2013/0270577 A1 | 10/2013 | Svederg et al. | |
| 2014/0138705 A1 | 5/2014 | Zhang et al. | |
| 2014/0169045 A1 | 6/2014 | Ueno | |
| 2014/0264564 A1 | 9/2014 | Cheng et al. | |
| 2014/0367771 A1 | 12/2014 | Chatty et al. | |
| 2016/0126347 A1 | 5/2016 | Wada et al. | |
| 2016/0233210 A1 | 8/2016 | Matocha et al. | |
| 2016/0254808 A1 | 9/2016 | Sato et al. | |
| 2018/0290893 A1 | 10/2018 | Dukes et al. | |
| 2019/0131188 A1 | 5/2019 | Chesin et al. | |

FOREIGN PATENT DOCUMENTS

| | | |
|---|---|---|
| JP | H09191109 A | 7/1997 |
| WO | 2015104084 A1 | 7/2015 |

OTHER PUBLICATIONS

"International Search Report and Written Opinion for corresponding International Application No. PCT/EP2018/074905 dated Dec. 5, 2018".

"Schoner et al., "{Invited} Progress in Buried Grid Technology for Improvements in on-Resistance of High Voltage SiC Devices", ECS Transactions.vol. 75, No. 12, Sep. 23, 2016 (Sep. 23, 2016), pp. 183-190."

Sung et al., "On Developing One-Chip Integration of 1.2 kV SiC MOSFET and JBS Diode (JBSFET) in IEEE Transactions on Industrial Electronics, vol. 64, Issue: 10, Oct. 2017".

"Sung et al., Monolithically Integrated 4H—SiC MOSFET and JBS Diode {JBSFET) Using a Single Ohmic/Schottky Process Scheme in IEEE Electron Device Letter, vol. 37, Issue 12, Dec. 2016, pp. 1605-1608".

\* cited by examiner

CONCEPT FOR SILICON CARBIDE POWER DEVICES

CROSS-REFERENCE TO RELATED APPLICATIONS

This application is a continuation of U.S. patent application Ser. No. 17/577,226, filed Jan. 17, 2022, which is a continuation of U.S. patent application Ser. No. 16/647,067, filed Mar. 13, 2020, now U.S. Pat. No. 11,276,681, which is a national stage of International PCT Application No. PCT/EP2018/074905, filed Sep. 14, 2018, which claims priority to Swedish Application No. 1751136-1 filed Sep. 15, 2017, the entire contents of which are hereby incorporated by reference herein.

TECHNICAL FIELD

The present invention relates to a cost-efficient modular method of designing and manufacturing an improved power device in SiC as well as the improved device itself.

BACKGROUND

In the state of the art, the fabrication of power semiconductors is usually divided up in epitaxial growth of the drift layer defining the blocking voltage and the processing of low voltage parts and edge termination. Because the specification of drift layer doping varies with voltage class this will influence the design of the low voltage part of the device.

It is known that a Buried Grid (BG) can be used to design a power device in two separate devices connected in series to divide the high voltage part for efficient blocking, and the low voltage part for efficient control of conduction (see for instance the BG MOSFET disclosed in WO99/26296 and U.S. Pat. No. 6,091,108). But it has not been presented how to design the high voltage part so that it can be used for different types of low voltage devices (DMOS, TrenchMOS, BJT, Schottky . . . ), and that the same low voltage device can be used for different voltage classes.

According to the state of the art, each specific area of a power device must be optimized for a specific voltage class, thus each voltage class and device type must be designed and fabricated in a dedicated process.

The integration techniques for a monolithically integrated solution on SiC are limited.

US 2014/0367771 discloses high voltage semiconductor devices and methods of making the devices.

U.S. Pat. No. 6,104,043 discloses a Schottky diode of SiC and a method for production thereof.

US2007/0228505 discloses a junction barrier Schottky rectifier having epitaxially grown $P^+$-N Junctions and methods of making it.

US2013/0270577 discloses a grid-UMOSFET with electric field shielding of the gate oxide.

US2014/0264564 discloses a field effect transistor device with buried well protection regions.

WO2015/104084 discloses a trench MOSFET Transistor Device and a corresponding production method.

US2016/0126347 discloses a silicon carbide semiconductor device.

EP2058854 discloses a semiconductor device.

U.S. Pat. No. 6,091,108 discloses a semiconductor device in SiC comprising two parts (1, 2) connected in series. The first sub-device (1) being able to withstand only low voltages in the blocking state thereof and a voltage-limiting part (2) being able to withstand high voltages in the blocking state.

M. Bakowski in Journal of telecommunications and information technology April 2009 25-36 entitled Prospects and development of vertical normally-off JFETs in SiC reviews the prospects of normally-off (N-off) JFET switches in SiC. The potential of selected vertical JFET concepts and all-JFET cascade solutions for N-off operation is analyzed using simulations.

Even though the methods of the prior art are used today there is still room for an improvement for instance with regard to the following problems: To shorten the development time of SiC power devices. Find a solution for efficient fabrication of different SiC power devices. Find a solution to facilitate the monolithic integration of different functions on SiC.

SUMMARY

It is an object of the present invention to obviate at least some of the disadvantages in the prior art and provide an improved power device in SiC.

After extensive research, it has been found that advantages can be obtained by designing a high voltage module (HVM) and a low voltage module (LVM) separately.

In a first aspect, there is provided a power device comprising a low voltage module (LVM) and a high voltage module (HVM), the LVM having a repeating structure in at least a first direction, the repeating structure repeats with a regular distance in at least the first direction, the HVM comprising a doped buried grid (4) with a repeating structure in at least a second direction, the repeating structure repeats with a regular distance in at least the second direction, the HVM and the LVM comprising doped SiC, the HVM comprising:
  a) a substrate (1) having a first conductivity type,
  b) an epitaxial drift layer (3) as a first drift layer with same or opposite conductivity type as the substrate (1), the epitaxial drift layer (3) is applied on the substrate (1),
  c) at least one epitaxial layer (7) as a second drift layer, of the same conductivity type as the epitaxial drift layer (3),
  d) a buried grid (BG) (4) of opposite conductivity type than the layers (3, 7),
  e) a feeder (5) with same conductivity type as BG (4), connected to BG (4),
  f) an edge termination (6a, 6b), formed in the same layer as BG (4) and feeder (5);
    the BG (4), feeder (5), and edge termination (6a, 6b) are applied in contact with the epitaxial drift layer (3) and the layer above the epitaxial drift layer (3),
    the at least one epitaxial layer (7) is applied on the epitaxial drift layer (3), BG (4), feeder (5), and edge termination (6a, 6b),
  the HVM comprises SiC without any added metal or insulating layers, the HVM has a blocking voltage $U_{B\ HVM}$;
the LVM comprising
  a) a feeder contact (8),
  b) at least one low voltage device (LVD) (9) having a blocking voltage $U_{B\ LVD}$ which is lower than $U_{B\ HVM}$,
  the feeder contact (8) of LVM being in contact with the feeder (5) of HVM, the at least one epitaxial layer (7) is a common layer for the HVM and the LVD (9).

Further aspects and embodiments are defined in the appended claims, which are specifically incorporated herein by reference.

One advantage is that the design allows high current density since the unit cell of the LVM can be designed independent of the buried grid (BG) (4) and thus all surface area can be used efficiently.

The surge current capability of the power device is defined by the feeder design and thus separated from the LVM.

There is provided a shorter development time for a wide range of power products. Independent development of the HVM and LVM is an advantage. An optimized HVM for a specific voltage class can be used for all type of devices. An optimized LVM can be used for several different voltage classes The cost of production and design is lower. Modular fabrication of HVM and LVM reduces the number of different fabrication processes needed for different device types and voltage classes, and manufacturing of each module can be more efficient when produced in larger volume.

Faster delivery is possible. Production time of a specific device type can be reduced if the HVM for the desired voltage class is produced in advance and kept in stock, so that different LVMs can be made on the stored HVMs. Further, HVMs can be manufactured and sold separately for further processing and addition of LVMs by other parties.

There is more freedom in design of the LVM in terms of the device dimensions, the doping concentration and thickness of the layers, geometries, the placement and alignment with the HVM, etc., due to separate electric field shielding by the HVM.

There is avalanche capability provided since the voltage blocking is designed in to the HVM giving PN-diode like avalanche behavior and since the LVM is physically separated from the BG.

It is possible to provide lower on-resistance with punch-through design of drift layer because the BG (4) lowers the electric field at the surface.

Less margin in design of drift layer is needed because the highest electric field is located in the drift layer bulk and away from the electric field sensitive parts of the LVM. Variations in doping and thickness in the drift layer fabrication are hence less critical and do not influence the electric field at the LVM very much. This makes it possible to reduce the thickness and/or increase the doping of the drift layer, and thus lower its resistance.

BRIEF DESCRIPTION OF THE DRAWINGS

The invention is described with reference to the following drawings in which.

DETAILED DESCRIPTION

Figure 1:
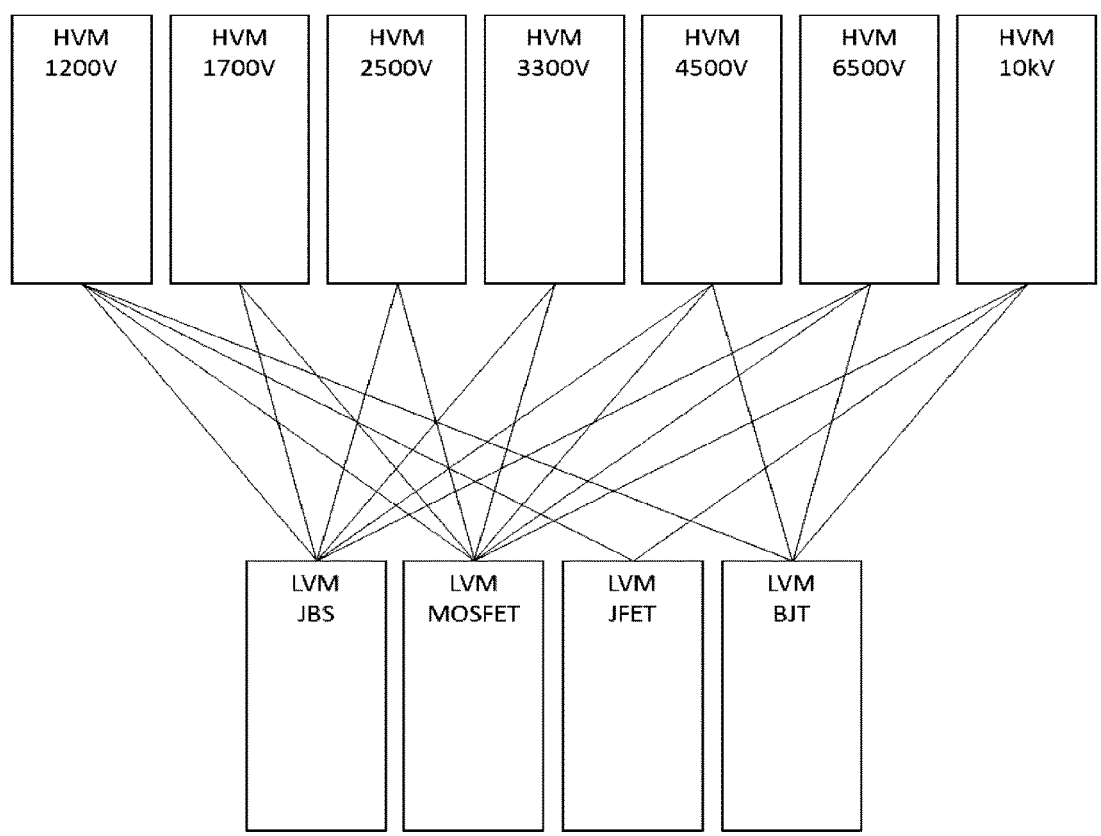
FIG. 1 shows a modular design divided in a High Voltage Module (HVM) and a Low Voltage Module (LVM).

FIG. 1 shows a modular design divided in a High Voltage Module (HVM) and a Low Voltage Module (LVM) for efficient production of wide range of power device products. In this example, there are 11 process modules (7 HVM+4 LVM) used for fabrication of 18 different device types.

Figure 2:
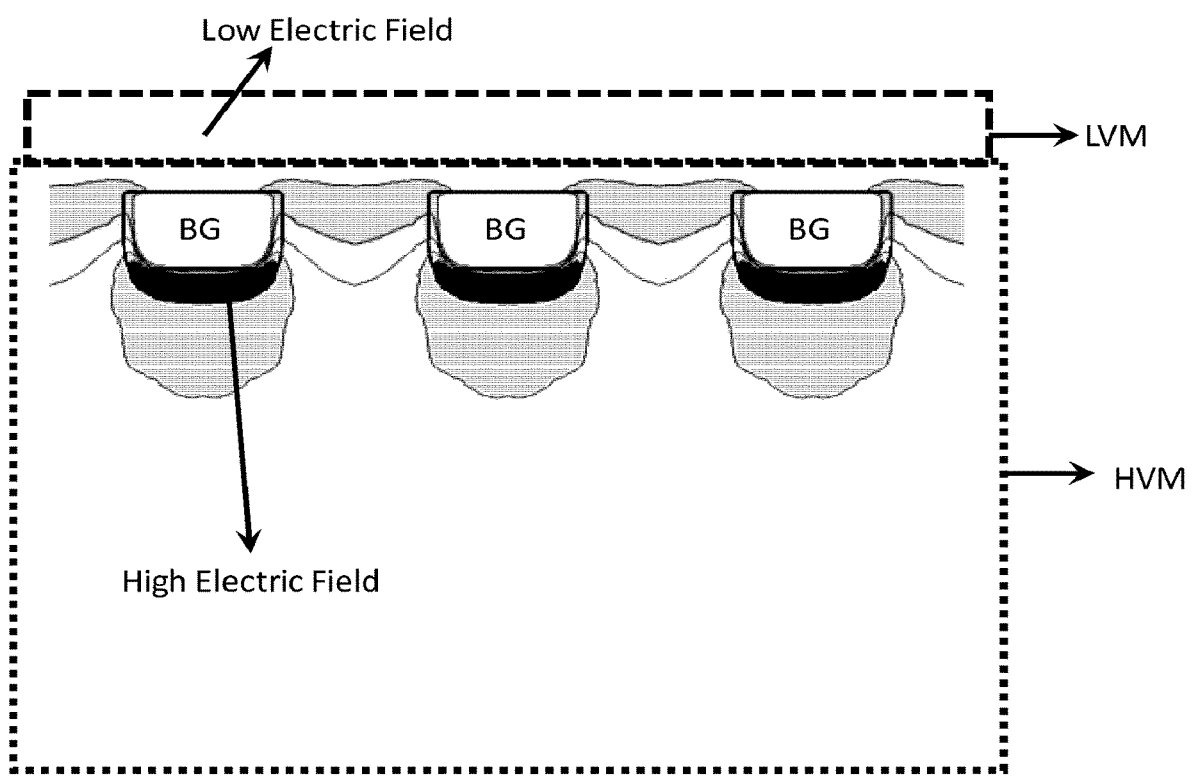
FIG. 2 shows the electric field distribution in a device with HVM and LVM regions.

FIG. 2 shows the electric field distribution in a device with HVM and LVM regions. A buried grid (BG) (4) shifts regions with high electric field to the bulk of the drift layer and shields the LVM. Hence, the electric field is significantly lower on the LVM part.

Figure 3B:
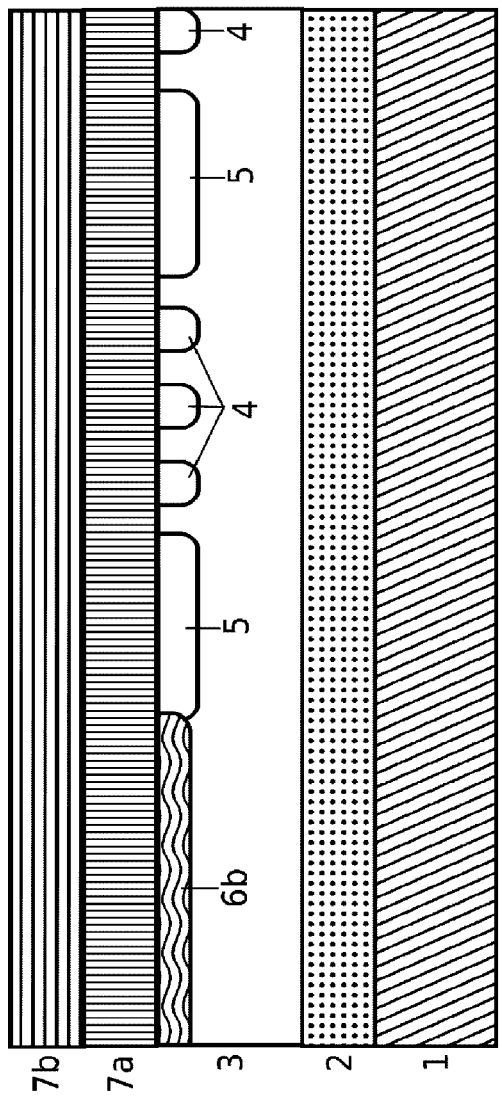
FIGS. 3A and 3B show cross-section schematics of the "High Voltage Module" with edge termination.
Figure 3A:
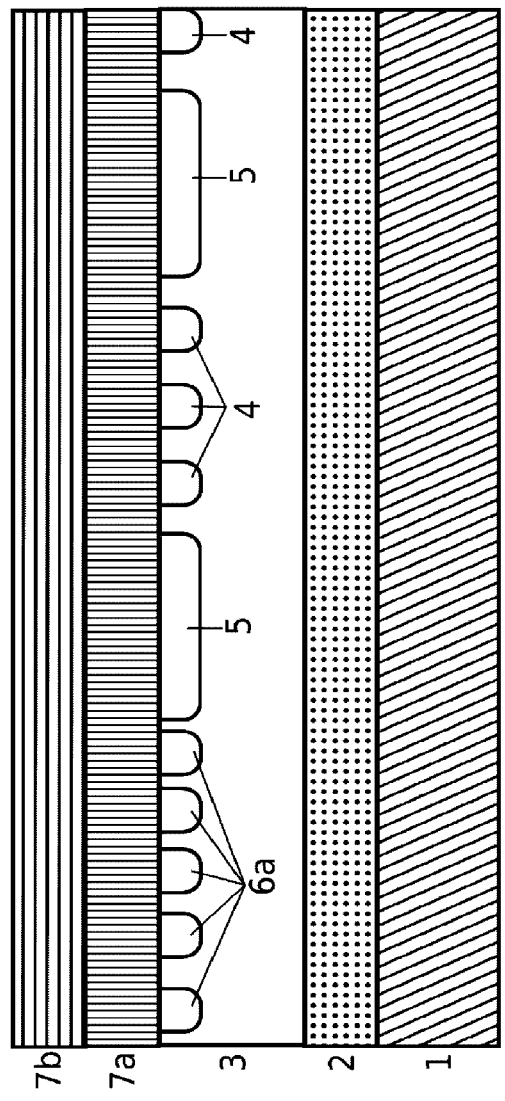

FIGS. 3A and 3B show a cross-section schematics of the "High Voltage Module" with an edge termination (FIG. 3A) up to 1.7 kV device and with an edge termination (FIG. 3B) for a generic design. The HVM includes: a substrate (1); an epitaxial buffer layer (2); an epitaxial layer (3) as a drift layer; a buried grid (BG) (4); a feeder (5); edge terminations (6a and 6b); and two epitaxial regrown layers (7a,7b) as an example.

Figure 4:
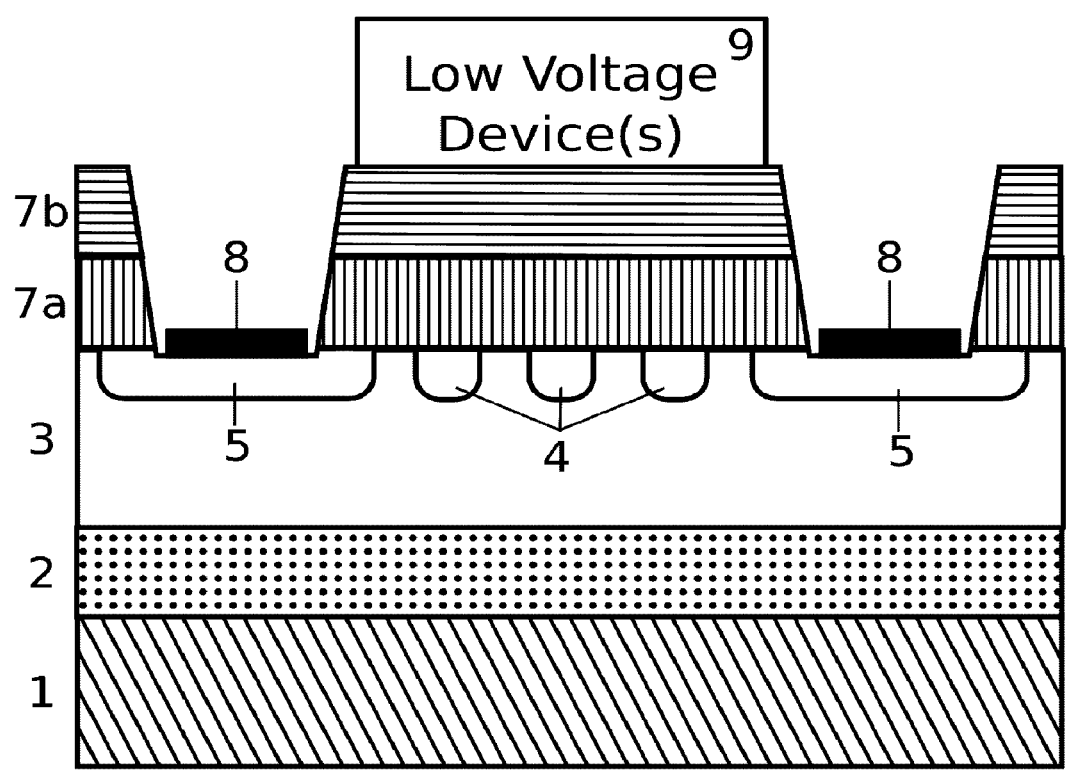
FIG. 4 shows a cross-section schematic of the combination of the "High Voltage Module" and the "Low Voltage Module".

FIG. 4 shows a cross-section schematic of a power device having the combination of the "High Voltage Module" and the "Low Voltage Module". The device includes: a substrate (1); an epitaxial buffer layer (2); an epitaxial layer as a drift layer (3); a buried grid (BG) (4); a feeder (5); two epitaxial regrown layers (7a, 7b) as an example; a feeder contact (8); and a Low Voltage Device (LVD) (9).

Figure 5:
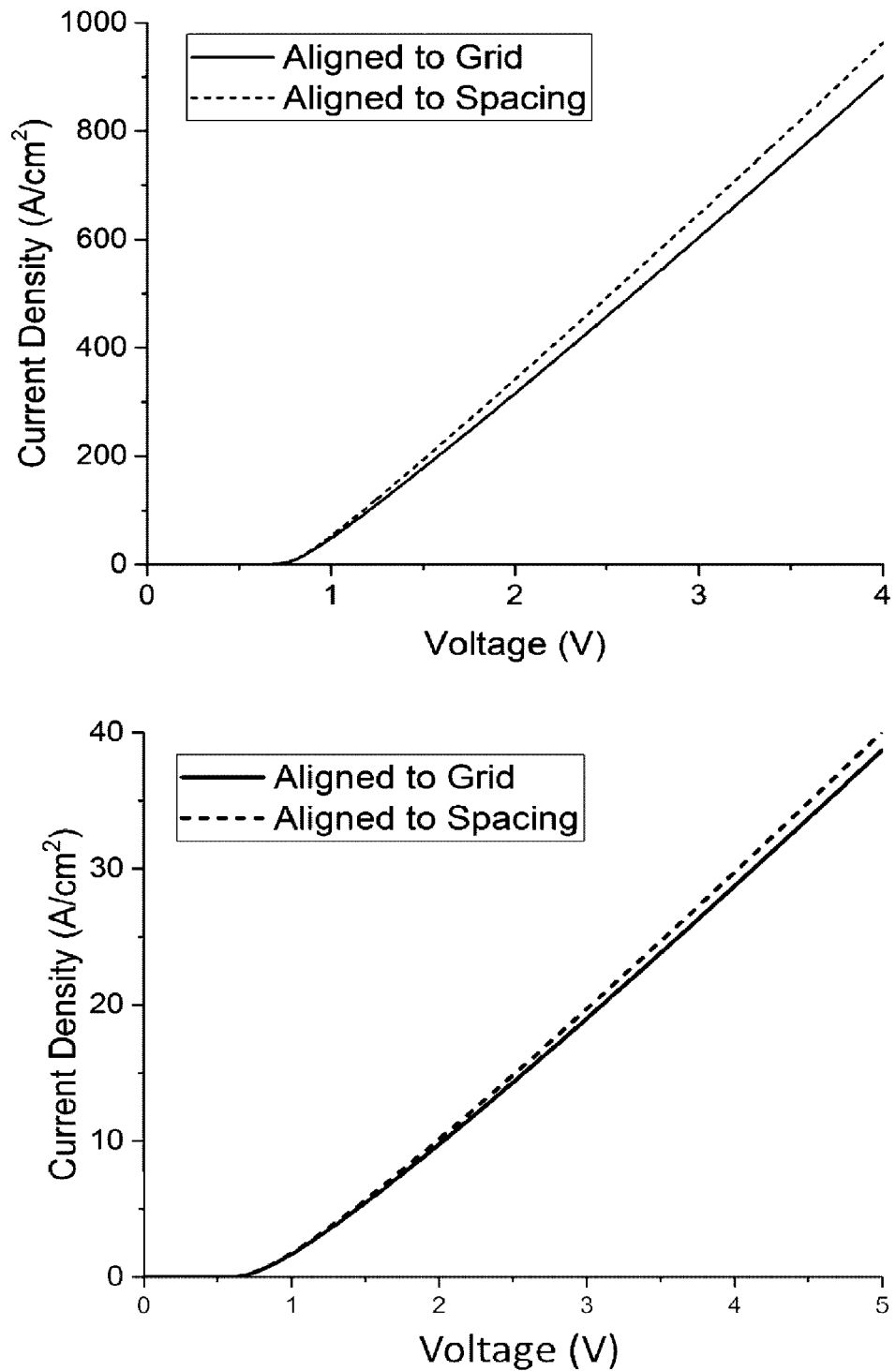
FIG. 5 shows simulation results of the maximum effect of aligning the top layer (e.g. Schottky diode) with the grid and with the spacing for the (top) 1.2 kV and (bottom) 10 kV rectifiers.

FIG. 5 shows simulation results of the maximum effect of aligning the top layer (e.g., Schottky diode) with the buried grid (4) and with the spacing for the (top) 1.2 kV and (bottom) 10 kV rectifiers. The solid and dashed curves show the low voltage device (LVD) aligned with the buried grid (4) and with the spacing, respectively.

Figure 6:
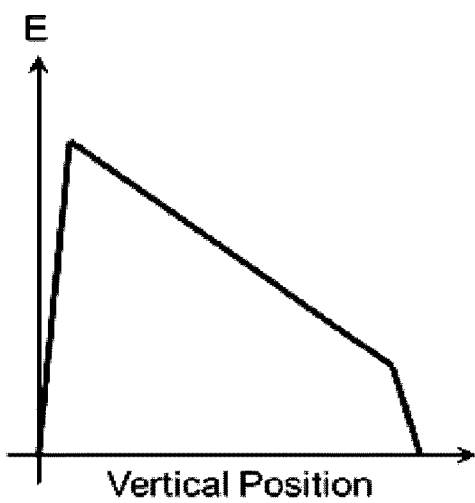
FIG. 6 shows a punch through design (Right side) which can be used with efficient blocking for the HVM.
Figure 6:
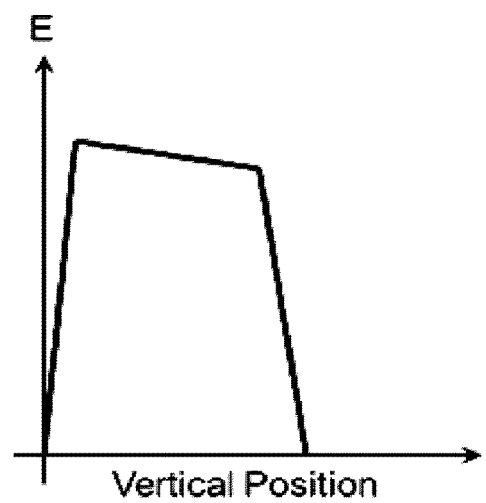

FIG. 6 shows a punch-through design (Right side) which can be used with efficient blocking for the HVM. The punch-through design gives a reduced thickness and/or increased doping of the epitaxial drift layer (3) and thus gives lower resistance. This concept makes it easier to use a punch-through design.

Figure 7A:
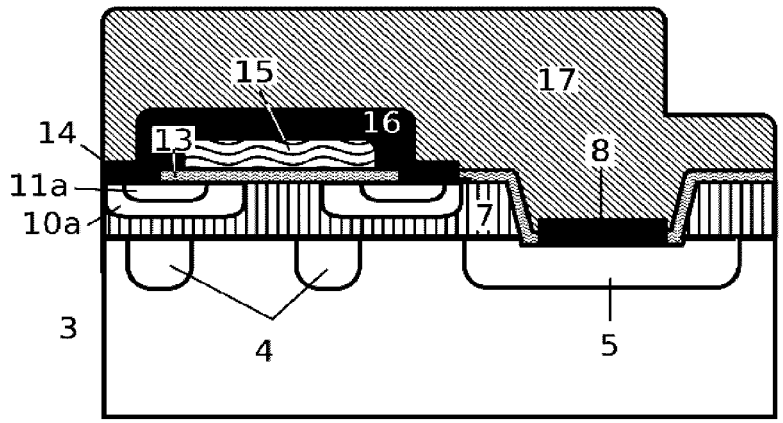
FIGS. 7A-7C show cross-section schematics of the modular concept with different designs.
Figure 7B:
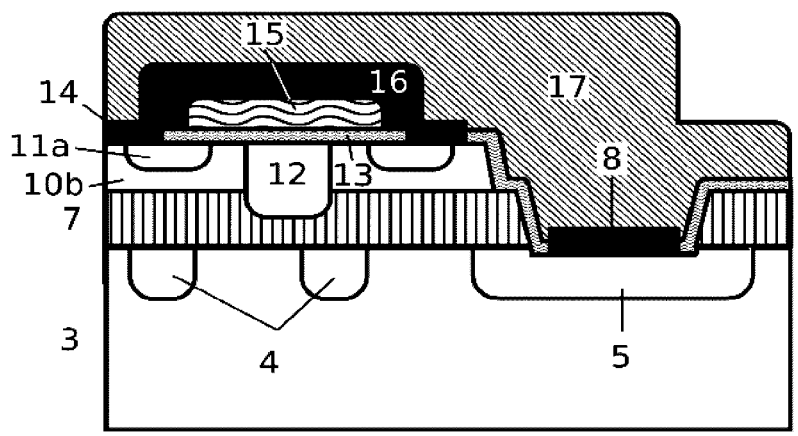
Figure 7C:
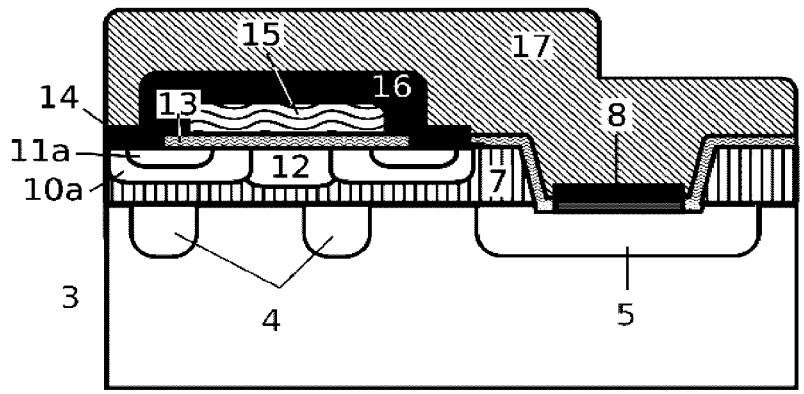

FIGS. 7A-7C show cross-section schematics of the modular concept of the power device with different designs. There are different versions of DMOSFETs used as the LVDs. The power devices include: an epitaxial layer (3) as a drift layer; a buried grid (BG) (4); a feeder (5); a set of epitaxial layers (7) (also referred to as 7a and 7b in case of two epitaxial layers); a feeder contact (8); a well region (10) with the same conductivity type as the buried grid (4); an implanted well region (10a); an epitaxial well region (10b) divided by a JFET implant region (12); and a source implant region (11a) with the same conductivity type as drift layers (3) and (7). The JFET implant region (12) has the same conductivity type as drift layers (3) and (7). In FIG. 7B, the JFET implant region (12) depth needs to be deeper than the thickness of the well layer (10b). In FIG. 7C, the purpose of the JFET implant region (12) is to reduce JFET resistance. The power devices include a Gate oxide (13); an Ohmic contact (14) connected to the source (11a) and the well regions (10a or 10b); a Gate (15) of metal or poly-Si; and an intermetal insulation (16) of oxide that separates the gate (15) from a source metallization (17). The source metallization (17) connects the MOSFET source (14) with the feeder contact (8).

Figure 8:
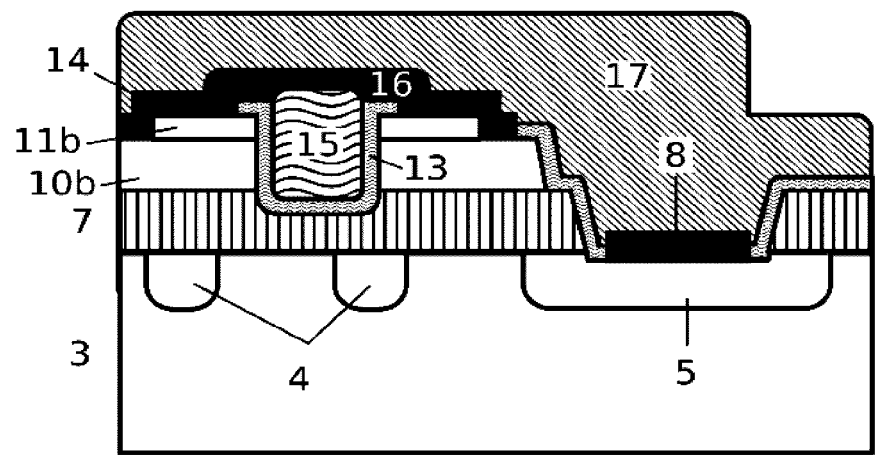
FIG. 8 shows a cross-section schematic of the modular concept applied to a Trench MOSFET (or U-MOSFET).

FIG. 8 shows a cross-section schematic of the modular concept of the power device applied to a Trench MOSFET (or U-MOSFET). The Trench or UMOSFET is used as the LVD. The power device includes: an epitaxial layer (3) as a drift layer; a buried grid (BG) (4); a feeder (5); a set of epitaxial layers (7) (also referred to as 7a and 7b in case of two epitaxial layers); a feeder contact (8); an epitaxial well region (10b) with the same conductivity type as the buried grid (4) divided by a trench; an epitaxial source region (11b) with the same conductivity type as the drift layers (3) and (7); a Gate oxide (13); an Ohmic contact (14) connected to the source (11b) and the well region (10b); a Gate (15) of metal or poly-Si; and intermetal insulation (16) of oxide that separates the gate (15) from a source metallization (17). The source metallization (17) connects the MOSFET source (14) with the feeder contact (8).

Figure 9:
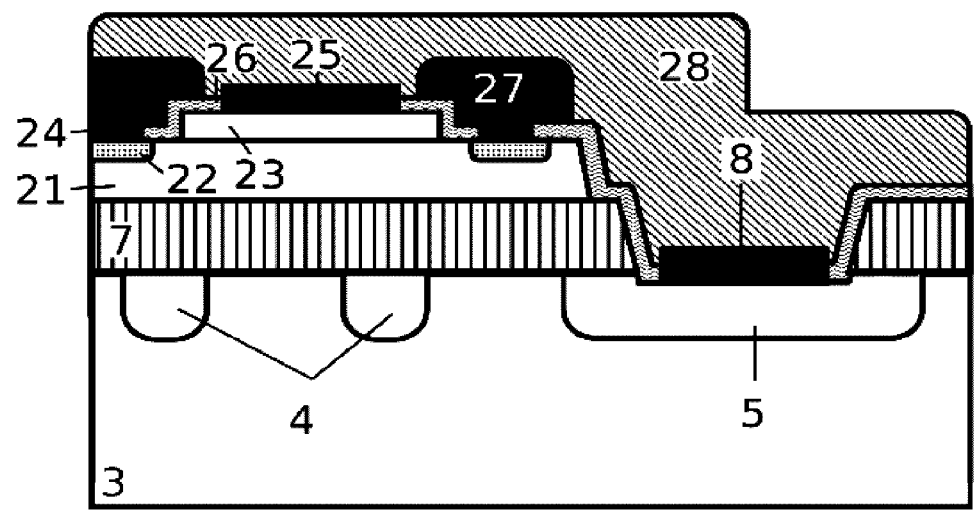
FIG. 9 shows a cross-section schematic of the modular concept applied to a BJT.

FIG. 9 shows a cross-section schematic of the modular concept of a power device applied to a BJT. The BJT is used as the LVD. The power device includes: an epitaxial layer (3) as a drift layer; a buried grid (BG) (4); a feeder (5); a set of epitaxial layers (7) (also referred to as 7a and 7b in case of two epitaxial layers); a feeder contact (8); an epitaxial base layer (21) with the same conductivity type as the buried grid (4); a base contact implant (22) with the same conductivity type as the base layer (21) and the buried grid (4); an Emitter layer (23) with the same conductivity type as drift layers (3) and (7); an Ohmic contact (24) connected to the base contact implant (22); an Ohmic contact (25) connected to the emitter layer (23); a surface passivation layer (26) of oxide; and intermetal insulation (27) of oxide that separates base contact (24) from an emitter metallization (28). The emitter metallization (28) connects the emitter contact (25) with the feeder contact (8).

Figure 10:
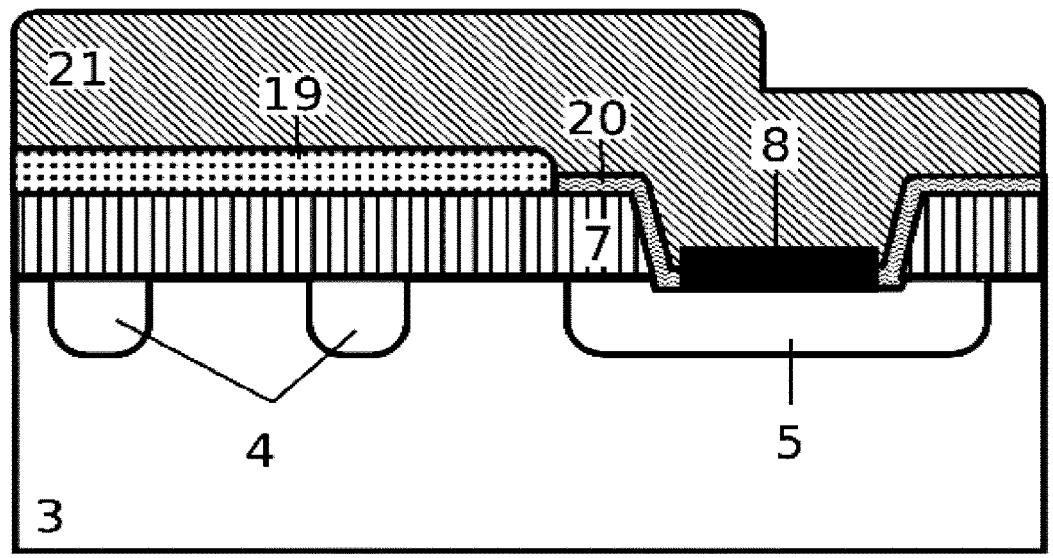
FIG. 10 shows a cross-section schematic of the modular concept applied to a JBS rectifier.

FIG. 10 shows a cross-section schematic of the modular concept of a power device applied to a JBS rectifier. A Schottky diode is used as the LVD. The power device includes: an epitaxial layer as a drift layer (3); a buried grid (BG) (4); a feeder (5); a set of epitaxial layers (7) (also referred to as 7a and 7b in case of two epitaxial layers), a Schottky contact (19); a surface passivation layer (20) of oxide; and Metallization (21) connecting the Schottky contact (19) with the feeder contact (8).

Figure 11:
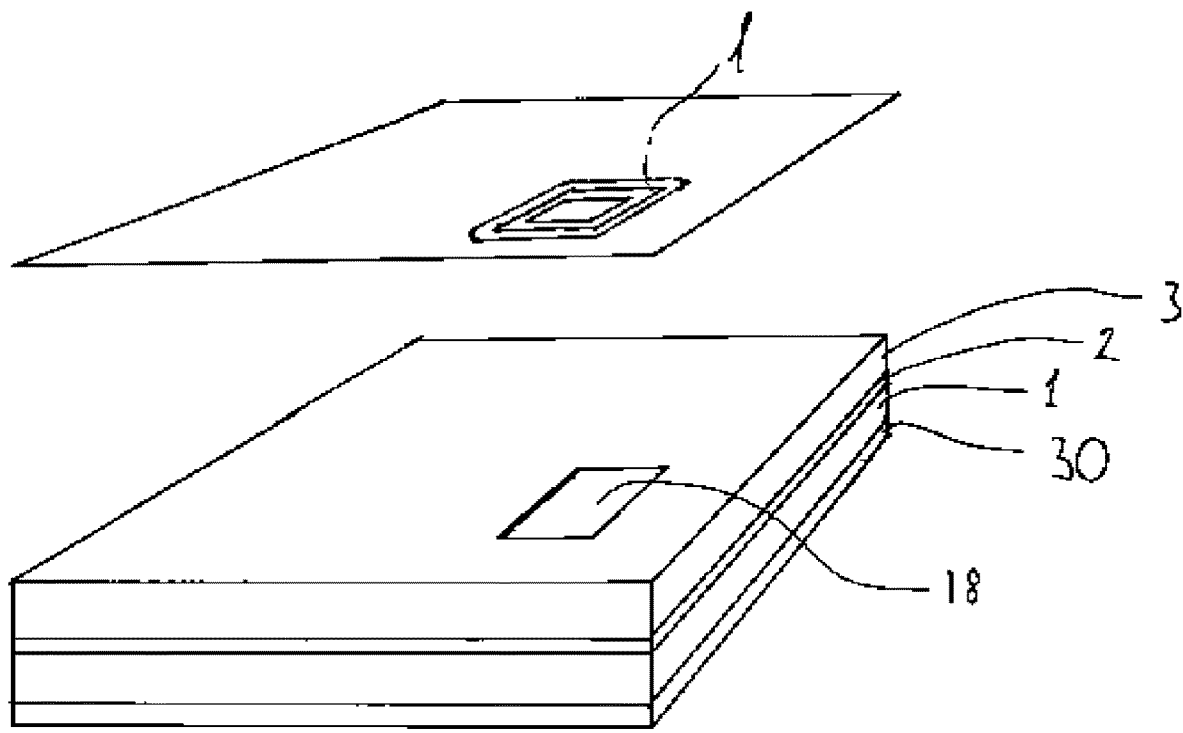
FIG. 11 shows parts of a device according to an embodiment of the invention, some parts are not shown for clarity.

FIG. 11 shows parts of a device according to an embodiment of the invention, some parts are not shown for clarity. There is shown a substrate (1), an epitaxial buffer layer (2), an epitaxial layer (3) as a drift layer, a backside metallization (30), and an epitaxially grown region (18). Additionally, there is shown a plane parallel with the substrate (1) and the projection of the epitaxially grown region (18) in the plane including the boundary line (l) of the projection in the plane. The surrounding of the boundary line (l) in the plane is indicated with solid lines, so that the distance from the boundary line (l) to any point in the surrounding is maximum 0.5 μm. Any corners of the surrounding area are rounded so that the surrounding around the line is determined by a circle with radius 0.5 μm which is moved along the boundary line (l).

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

"Blocking voltage" as used throughout the description and the claims denotes the maximum reverse dc voltage that will not cause breakdown of a semiconductor component such as diode or a more complex component.

"Buried grid" as used throughout the description and the claims denotes a grid structure of a material with one conductivity type in a material with the opposite conductivity type.

"Conductivity type" as used throughout the description and the claims denotes the type of conduction in a semiconductor material. N-type denotes electron conduction meaning that excess electrons move in the semiconductor giving a current flow and p-type denotes hole conduction, meaning that excess holes move in the semiconductor giving a current flow. A n-type semiconductor material is achieved by donor doping and a p-type semiconductor by acceptor dopants. In SiC, nitrogen is commonly used as donor dopant and aluminum as acceptor dopant. If a material is a doped semiconductor such as SiC, the material either has conductivity type p or conductivity type n.

"Current spreading layer" as used throughout the description and the claims denotes a layer which is applied to ensure that the injected current is spread as evenly as possible across the whole active area of the device.

"Doped" as used throughout the description and the claims denotes that an intrinsic semiconductor such as SiC has got added impurities to modulate its electrical properties and become an extrinsic semiconductor.

"Epitaxial" as used throughout the description and the claims denotes that the material has been manufactured with epitaxial growth, in this case epitaxial growth of SiC.

"High voltage module" and "low voltage module" as used throughout the description and the claims refer to the intended voltage in a relative sense compared to each other so that the intended voltage for the high voltage module is higher than the intended voltage for the low voltage module.

"Repeating structure" as used throughout the description and the claims denotes a structure that repeats in a regular manner with a certain distance, pitch.

"Substrate" as used throughout the description and the claims denotes a piece of material on which the power device is built up.

In a first aspect, there is provided a power device comprising a low voltage module (LVM) and a high voltage module (HVM), the LVM having a repeating structure in at least a first direction, the repeating structure repeats with a regular distance in at least the first direction, the HVM comprising a doped buried grid (4) with a repeating structure in at least a second direction, the repeating structure repeats with a regular distance in at least the second direction,
the HVM and the LVM comprising doped SiC,
the HVM comprising:
  a) a substrate (1) having a first conductivity type,
  b) an epitaxial drift layer (3) as a first drift layer with same or opposite conductivity type as the substrate (1), the epitaxial drift layer (3) is applied on the substrate (1),
  c) at least one epitaxial layer (7) as a second drift layer, of the same conductivity type as the epitaxial drift layer (3),
  d) a buried grid (BG) (4) of opposite conductivity type than the layers (3, 7),
  e) a feeder (5) with the same conductivity type as BG (4), connected to BG (4),
  f) an edge termination (6a, 6b), formed in the same layer as BG (4) and feeder (5);
    the BG (4), the feeder (5), and the edge termination (6a, 6b) are applied in contact with the epitaxial drift layer (3) and the layer above the epitaxial drift layer (3),
    the at least one epitaxial layer (7) is applied on the epitaxial drift layer (3), the buried grid (BG) (4), the feeder (5), and the edge termination (6a, 6b),
  the HVM comprises SiC without any added metal or insulating layers, the HVM has a blocking voltage $U_{B\_HVM}$;
the LVM comprising:
  a) a feeder contact (8), and
  b) at least one low voltage device (LVD) (9) having a blocking voltage $U_{B\_LVD}$ which is lower than $U_{B\_HVM}$;
  the feeder contact (8) of the LVM being in contact with the feeder (5) of the HVM,
  the at least one epitaxial layer (7) is a common layer for the HVM and the LVD (9).

The first direction is any direction selected so that there is a repeating structure that repeats itself regularly when moving along the selected direction. To determine if there is a repeating structure in a direction, a line in that direction is drawn and any structures crossing the line are investigated to see if the structures repeat. The distance from one repeating feature to the next corresponding repeating feature is called the pitch. The same applies to the second direction. The first and second directions may be the same or different. Examples of repeating structures include, but are not limited to, regularly spaced hexagons, circles, squares, rectangles, triangles, lines and so on of a differently doped SiC. Typically, the repeating structures are made of doped SiC where the doping alternatingly has opposite conductivity types, i.e., n and p.

The first epitaxial drift layer (3) can be either an n-type epitaxial layer or a p-type epitaxial layer. In one embodiment, the first epitaxial drift layer (3) is an n-type epitaxial layer. In an alternative embodiment, the first epitaxial drift layer (3) is a p-type epitaxial layer. Epitaxial means that the layer is made by epitaxial growth of SiC.

The HVM should not comprise any metal or insulating layers, i.e., layers of elemental metal, silicon dioxide, or silicon nitride. The subsequent addition of the LVM is then simplified. Added metal would disturb or make subsequent addition of the LVM impossible. The addition of the LVM requires process steps that can only be performed without layers of elemental metal.

The HVM and LVM can be produced separately in a modular way and thus enable production of a wide range of different products with a few standardized fabrication processes.

The buried grid (BG) (4) can also be called a junction barrier grid. The cell structure of the BG (4) of the HVM (see FIG. 2) is independent of the unit cell structure of the LVM. By this, the device area can be used efficiently and optimized separately for each type of device and voltage class.

The structure consisting of the drift layer (3), the buried grid (BG) (4), and the termination (6a, 6b) blocks the voltage and shields the LVM from high electric field so that the electric field at the LVM and thereby also at the LVD is lower.

The feeder (5) is a potential reference in the final device, i.e., a packaged component made of the power device.

The edge termination (6a, 6b) consists either of termination zones (6a) or termination rings (6b) or a combination of both. If seen from above, the termination is in one embodiment a zone around the active area, i.e., a JTE zone with modulated doping and blocking voltage dependent width. In one embodiment, there are two JTE zones with modulated doping around the active area. In an alternative embodiment, the edge termination is a region around the active device area comprising floating guard rings. In one embodiment, the edge termination is a combination of JTE zone termination and floating guard ring termination. In such a combination embodiment, the zone(s) can also comprise rings. The termination area spread the electric field laterally to target the optimal breakdown voltage. For blocking voltage up to 2 kV, the edge termination can be floating guard rings with the same doping profile as feeders (5) and grid (4) (FIG. 3A).

The LVM design is independent of the HVM design. So, the design of the LVM for a specific device is the same for all voltage classes.

Due to the shielding of the electric field by the HVM, the design of the LVM and thereby the LVDs can be optimized with less constraints. This allows, for example, lower p-well doping concentration for a MOSFET resulting in higher mobility of the channel.

The HVM is designed for a specific voltage class and is optimized to fit different types of LVDs (9). The buried grid (BG) (4) design is the part of the HVM that should be adapted to protect the LVM and thereby protect the LVD (9) against high electric field. The properties of the buried grid (BG) (4) including the doping concentration and profile, thickness, width, and spacing should be optimized for a reasonable trade-off between conducting and blocking modes.

In one embodiment, the HVM comprises an epitaxial buffer layer (2) between the substrate (1) and the epitaxial drift layer (3). The epitaxial buffer layer (2) is of the same conductivity type as the epitaxial drift layer (3).

In one embodiment, the at least one epitaxial layer (7) comprises at least two epitaxial layers (7a and 7b) of the same conductivity type as the epitaxial drift layer (3), each layer (7a and 7b) having different doping levels and thicknesses and can be either a current spreading layer or a second drift layer. A current spreading layer improves the lateral distribution of the current and can thus improve the performance of the device. In one embodiment, the epitaxial regrown layer (7a) closest to the buried grid layer (4) has a higher doping concentration compared to the epitaxial regrown layer (7b) furthest away from the buried grid layer (4).

In one embodiment, the epitaxial regrown layer (7) has a gradient in the doping concentration. In one embodiment, the gradient has the highest doping concentration closest to the buried grid layer (4). In another embodiment, the gradient has the lowest doping concentration closest to the buried grid layer (4). In one embodiment, there is a gradient from low-to-high-to-low going away from the buried grid layer (4). In one such embodiment, the doping concentration in the epitaxial regrown layer (7) is lower closest to the buried grid layer (4) and furthest away from the buried grid layer (4) compared to the middle part of the epitaxial regrown layer (7).

In one embodiment, there is a common electrode between the feeder contact (8) and a source ohmic contact (14). In one embodiment, there is a common electrode between the feeder contact (8) and an emitter ohmic contact (25). In one embodiment, there is a common electrode between the feeder contact (8) and a contact (19). This common electrode couples in parallel the LVD and the feeder PN-diodes, which protect the LVD from overcurrent like surge currents or short circuit currents. This design can be utilized for instance for JBS diodes or power MOSFETs.

The fact that the buried grid (BG) (4) is physically separated from the LVM ensures good avalanche capability of the device in blocking.

In one embodiment, the LVM comprises at least two low voltage devices (LVDs).

In one embodiment, the power device comprises a MOSFET switch and Schottky diode in parallel as LVDs.

In one embodiment, the epitaxial drift layer (3) has a thickness in the range of 3 to 300 μm. In one embodiment, the epitaxial drift layer (3) has a thickness in the range of 7 to 100 μm. In one embodiment, the epitaxial drift layer (3) has a thickness in the range of 10 to 100 μm. The thickness of the epitaxial drift layer (3) depends on voltage class, and for instance, 10 μm and 100 μm drift layers are suitable for 1200V and 15 kV devices, respectively. The doping level in the epitaxial drift layer (3) should be adapted to the thickness and voltage class. For thin layers towards the lower end of the interval 3-300 μm, a doping concentration around the order of magnitude $1e16\ cm^{-3}$ is suitable as a starting point. For thicker layers towards the upper end of the interval 3-300 μm, a doping concentration around the order of magnitude $1e14\ cm^{-3}$ is suitable.

In one embodiment, the buried grid (4) has a doping concentration in the range of $3e17\ cm^{-3}$ to $3e20\ cm^{-3}$, a space between adjacent members of the buried grid (4) in the range of 1 to 5 μm, a thickness of the buried grid (4) in the range of 0.5 to 2 μm, and a width of the members of the buried grid (4) of more than 0.5 μm. In one embodiment, the members of the buried grid (4) have a width in the interval 0.5 to 2 μm.

In one embodiment, the at least one epitaxial layer (7) have a thickness of more than 0.3 μm, and a doping concentration in the range of $1e14\ cm^{-3}$ to $1e17\ cm^{-3}$. To have an optimum shielding effect, the thickness and doping concentration of the regrown layer closest to the buried grid (4) depends on the voltage class.

In one embodiment, the at least one epitaxial layer (7) has a thickness in the range of 1 to 1.5 μm.

The feeder (5) defines the surge current capability of the device. A minimum width of 10 μm is typically needed for <2 kV compared to 50 μm for 10 kV devices. In one embodiment, the feeder (5) has a width of at least 10 μm. In one embodiment the feeder (5) has a width of at least 50 μm.

The design of the HVM and LVM are independent. In one embodiment along any possible defined direction, the pitch, i.e., the distance between repeating structures of the LVM, is not the same as the pitch of the HVM, the distances measured along the same direction. For a typical design, for instance, the buried grid (4) can repeat thousands of times along a direction. In the drawings, the repetitions are shown only a few times or as one repeating structure for clarity. Similarly, the LVM may comprise repeating structures, which also may repeat many times in a typical component. The shape or geometry of the buried grid (4) design can be different than the unit cell of the LVD (9) (e.g., stripes geometry for grid and Hexagon for LVD). Thanks to the shielding of the LVM parts by the HVM parts, the alignment of the grid of HVM and unit cell of LVD has no dramatic effect on the performance of the device, particularly for high-voltage devices (FIG. 5). Note that the feeder contact (8) is in contact with the feeder (5) of HVM and is in general not a part of the repeating structure of the buried grid (4). Instead, it typically has a repeating structure with much larger pitch than the buried grid (4). In the drawings of FIGS. 7A through 9, the connection between the feeder contact (8) and the feeder (5) is shown to the right, to the left a unit cell of the LVD repeating structures is shown. The structures to the left in FIGS. 7A through 9 are thus repeated many times in a typical component.

The high electric field is sustained by the epitaxial drift layer (3) and by the buried grid (4), and thus the epitaxial drift layer (3) is not limited by the design rules of the LVD (9). Therefore, it is possible to decrease the thickness and increase the doping concentration of the epitaxial drift layer (3) according to such of the punch-through design for a PiN rectifier. This results in higher conductivity and lower on-resistance of the device with no influence on the voltage blocking performance. See FIG. 6.

In one embodiment, at least one of the buried grid (4) and feeder (5) is formed by epitaxially filled trenches.

In one embodiment, the at least one LVD comprises areas shaped as hexagons.

In one embodiment, the substrate (1) and the epitaxial drift layer (3) are n-type. Today, the most common commercially available substrates are n-type, but the invention can be used with equally good results if the substrate (1) and the epitaxial drift layer (3) are p-type. In one embodiment, either the combination of an n-type substrate (1) and a p-type epitaxial drift layer (3), or the combination of a p-type substrate (1) and an n-type epitaxial drift layer (3) are used. Devices fabricated with such a combination are IGBTs, for example.

In one embodiment, the buried grid (4) comprises a plurality of grids, wherein at least a part of the grids has a ledge positioned centered under the grid, said ledge positioned towards the substrate (1), said ledge having a smaller lateral dimension than the grid. In this embodiment there is an increase in the electric field shielding efficiency of the grid which is reducing the electric field on the surface of the device. This increase the blocking voltage and lower the leakage current without adding forward resistance. Alternatively, a wider grid spacing can be used with this design, leading to lower on-resistance. The structure is more tolerant to process variations such as misalignment, dose and energy variation in ion implantation, etching depth, etc.

In one embodiment, the buried grid (4) comprises a plurality of grids and wherein each grid comprises an upper part and a lower part, said lower part is towards the substrate (1), wherein the upper part is manufactured using epitaxial growth, and wherein the lower part is manufactured using ion implantation. In this embodiment, it is possible to manufacture a grid with rounded corners as well as an upper part with a high doping level. It is possible to manufacture a component with efficient voltage blocking, high current conduction, low total resistance, high surge current capability, and fast switching.

In one embodiment, the epitaxial drift layer (3) comprises a current spreading layer (CSL) located between the buried grid (4) and the epitaxial buffer layer (2). The CSL has the effect of spreading out the current more efficiently under the buried grid (4). In one embodiment, the CSL is directly under the buried grid (4) and in contact with the buried grid (4). In one embodiment, the CSL is close to the buried grid (4).

In one embodiment, there is at least one epitaxially grown region (18) of the same conductivity type as the feeder (5) and the buried grid (4) in contact with the ohmic contact (8), wherein the feeder (5) comprises at least one region for each epitaxially grown region (18), wherein a projection of the epitaxially grown region (18) in a plane parallel with the substrate (1) has a boundary line (l) limiting the projection of the epitaxially grown region (18), wherein the feeder layer (5) is applied at least so that a projection of the feeder (5) in a plane parallel to the substrate (1) is in a surrounding of the boundary line (l), so that the distance from the boundary line (l) to any point in the surrounding is maximum 0.5 µm and wherein the feeder (5) also is applied so that the distance from the lower part of the epitaxially grown region (18) to the upper part of the feeder (5) is in the range 0-5 µm, the direction up is given by the direction perpendicular away from the n-type substrate (1). The feeders close to the corners of the feeder contact (8) have the effect of reducing the negative effects of the sharp corners of the epitaxially grown region (18) regarding the electrical field.

The surrounding of the boundary line (l) can be determined so that a circle with radius 0.5 µm is moved along the boundary line (l) and the area swept over by the circle is within the surrounding so that the distance from the boundary line (l) to any point in the surrounding is maximum 0.5 µm. This is applicable to any shape of the boundary line (l). If the epitaxially grown region (18) has the form of a very long trench there may be two boundary lines. If viewed from above, i.e., from a position looking at the largest area of the n-type substrate (1), then the p-type feeder (5) is applied close to the boundary of the epitaxially grown region (18), more in particular within ±0.5 µm from the boundary line. This defines a surrounding of ±0.5 µm from the boundary line and the p-type feeder (5) is applied at least in this surrounding, it can also be applied outside this surrounding. The p-type feeder (5) should also be applied fairly close to the epitaxially grown region (18), seen from the side, i.e. looking at a cross-cut of the device. Then the p-type feeder (5) is either in contact with the epitaxially grown region (18), or maximum 5 µm below the epitaxially grown region (18). Since the projection of the epitaxially grown region (18) is used to determine the boundary line (l), the largest part of the epitaxially grown region (18) determines the position of the p-type layer (5). Since the cross-section of the p-type feeder (5) is fairly close to rectangular, the condition will imply that the p-type feeder (5) is applied at least close to the corners where they will mitigate the effects of the sharp corners on the electrical field.

In a second aspect, there is provided a method of manufacturing a power device in SiC comprising a low voltage module (LVM) and a high voltage module (HVM), the low voltage module (LVM) having a repeating structure in at least a first direction, the repeating structure repeats with a regular distance in at least the first direction, the high voltage module (HVM) comprising a doped buried grid (4) with a repeating structure in at least a second direction, the repeating structure repeats with a regular distance in at least the second direction, the HVM and the LVM comprising doped SiC.

In one embodiment, the HVM is manufactured first and then a LVM is manufactured on the HVM. This enables manufacture of a number of standardized HVMs which may be stored for future use of sold. When a specific component is to be manufactured a LVM is added on top of a standardized HVM.

In one embodiment, the LVM and the HVM are manufactured separately and then assembled.

In one embodiment, the manufacture of the LVD comprises at least one selected from the group consisting of patterning of the at least one epitaxial layer (7) and addition of further epitaxial layers.

In one embodiment, the manufacture of the LVD comprises at least one method selected from the group consisting of selective doping, contact, oxide, etching, and epitaxial growth.

To make processing of subsequent steps more uniform, it is advantageous if wafer thickness is kept within certain limits, e.g. for same cooling, gas flows or optical alignment. To enable this, the substrate could be thinned after the epitaxy growth or substrates with different thickness could be used.

In one embodiment, the blocking voltage of the LVD, Us LVD is lower than 10% of the blocking voltage of the HVM, $U_{B\ HVM}$. In one embodiment the blocking voltage of the LVD, $U_{B\ LVD}$ is 100 V or lower.

The invention claimed is:

1. A power device, comprising:
   a high voltage module comprising:
     a substrate having a first conductivity type;
     a first drift layer on the substrate, the first drift layer having one of (i) a same conductivity type as the substrate and (ii) an opposite conductivity type as the substrate;
     a buried grid on the first drift layer, the buried grid having a conductivity type opposite to the conductivity type of the first drift layer; and
     a second drift layer on the first drift layer and the buried grid, the second drift layer having conductivity type of a same conductivity type as the first drift layer; and
   a low voltage module in electrical contact with the high voltage module, the low voltage module having at least one low voltage device with a blocking voltage less than a blocking voltage of the high voltage module,
   wherein the at least one low voltage device has at least one other epitaxial layer as a common layer with the high voltage module.

2. The power device of claim 1, wherein the substrate comprises doped SiC.

3. The power device of claim 1, wherein the first drift layer comprises an epitaxial layer.

4. The power device of claim 1, wherein the second drift layer comprises an epitaxial layer.

5. The power device of claim 1,
   wherein the high voltage module comprises a first repeating structure that repeats with a first regular distance in at least a first direction, and
   wherein the low voltage module comprises a second repeating structure that repeats with a second regular distance different from the first regular distance in at least a second direction different from the first direction.

6. The power device of claim 1, wherein the low voltage module comprising doped SiC.

7. The power device of claim 1, wherein the high voltage module further comprises:
- a feeder formed in the first drift layer, the feeder having the same conductivity type as the buried grid and being connected to the buried grid; and
- an edge termination formed in the first drift layer along with the buried grid and the feeder.

8. The power device of claim 7, wherein at least one of the buried grid and the feeder is formed by epitaxially filled trenches.

9. The power device of claim 7, wherein the low voltage module comprises a feeder contact in electrical contact with the feeder of the high voltage module.

10. The power device of claim 7, wherein the feeder formed in the first drift layer is in contact with an ohmic contact.

11. The power device of claim 1, wherein the high voltage module further comprises an epitaxial buffer layer disposed between the substrate and the first drift layer, the epitaxial buffer layer having the same conductivity type as the first drift layer.

12. A power device, comprising:
- a high voltage module comprising:
  - a substrate having a first conductivity type;
  - a first drift layer on the substrate, the first drift layer having one of (i) a same conductivity type as the substrate and (ii) an opposite conductivity type as the substrate;
  - a buried grid on the first drift layer, the buried grid having a conductivity type opposite to the conductivity type of the first drift layer; and
  - a second drift layer on the first drift layer and the buried grid, the second drift layer having conductivity type of a same conductivity type as the first drift layer; and
- a low voltage module in electrical contact with the high voltage module, the low voltage module comprising:
  - at least one low voltage device with a blocking voltage less than a blocking voltage of the high voltage module, and
  - a common electrode between a feeder contact of the low voltage module and one of an ohmic contact of the low voltage module.

13. The power device of claim 12, wherein the ohmic contact of the low voltage module comprises one of (i) a source ohmic contact and (ii) an emitter ohmic contact.

14. The power device of claim 12, wherein the low voltage module comprises a switch and a diode disposed in parallel.

15. The power device of claim 12, wherein the at least one low voltage device comprises areas having geometric shapes.

16. The power device of claim 12, wherein the buried grid comprises:
- a plurality of buried grid members,
- wherein at least a part of the plurality of buried grid members has a ledge centered under the buried grid,
- wherein the ledge is positioned towards the substrate, and
- wherein the ledge has a lateral dimension smaller than the buried grid.

17. A power device, comprising:
- a high voltage module comprising:
  - a substrate having a first conductivity type;
  - a first drift layer on the substrate,
  - a plurality of buried grid members on the first drift layer, each of the plurality of buried grid members having a conductivity type opposite to the conductivity type of the first drift layer; and
  - a second drift layer on the first drift layer and the plurality of buried grid members; and
- a low voltage module in electrical contact with the high voltage module.

18. The power device of claim 17,
- wherein the first drift layer has one of (i) a same conductivity type as the substrate and (ii) an opposite conductivity type as the substrate, and
- wherein the second drift layer has conductivity type of a same conductivity type as the first drift layer.

19. The power device of claim 17, wherein at least a part of the plurality of buried grid members has a ledge centered under the plurality of buried grid members.

20. The power device of claim 19, wherein the ledge has a lateral dimension smaller than the plurality of buried grid members.

* * * * *